United States Patent [19]

Yasunaga

[11] Patent Number: 4,994,733
[45] Date of Patent: Feb. 19, 1991

[54] POTENTIOMETER FOR VOLTAGE-MEASURING INSTRUMENT

[75] Inventor: Soichiro Yasunaga, Kawasaki, Japan

[73] Assignee: Riken Denshi Co., Ltd., Kawasaki, Japan

[21] Appl. No.: 303,955

[22] Filed: Jan. 31, 1989

Related U.S. Application Data

[63] Continuation of Ser. No. 868,433, May 30, 1986, abandoned.

[30] Foreign Application Priority Data

Mar. 6, 1986 [JP] Japan .................................. 61-49251

[51] Int. Cl.$^5$ ..................... G01R 15/04; G01R 15/06; G01R 15/08
[52] U.S. Cl. ...................................... 324/115; 324/126
[58] Field of Search ...................... 324/115, 126, 99 D, 324/123 R, 72.5

[56] References Cited

U.S. PATENT DOCUMENTS

| 3,553,580 | 1/1971 | Matthews | 324/115 |
| 3,810,012 | 5/1974 | Harris | 324/73 R |
| 4,000,463 | 12/1976 | Katzmann et al. | 324/115 X |
| 4,433,287 | 2/1984 | Morita et al. | 324/123 R X |

FOREIGN PATENT DOCUMENTS

| 66869 | 4/1983 | Japan | 324/76 R |

OTHER PUBLICATIONS

*The Radio and Electronic Engineer*, vol. 40, No. 1, Pearce et al.,; "Digital Carry Applied to Successive Approximation Digital Voltmeters", Jul. 1970, pp. 27-32.
IEEE Trans. on Instrum. and Meas., vol. IM-21, No. 4, Julie, "A High-Accuracy Digital Instrument Design for D.C. Measurements", Nov. 1972, pp. 323-8.
*Electronic Technology*, vol. 21, No. 1, Macalister et al., "A Transfer Standard Digital Voltmeters", Jan. 1978, pp. 3-8.

Primary Examiner—Jerry Smith
Assistant Examiner—Stephen M. Baker
Attorney, Agent, or Firm—William J. Daniel

[57] ABSTRACT

A potentiometer used with a voltmeter has an impedance transformer to which a voltage to be measured is applied, a bank of resistors acting collectively as a variable resistor and having switches connected in parallel across the respective resistors of the bank, a switch control circuit, and a multiplier-setting circuit, all connected in series. The resistors have resistances $r$, $2r$, $4r$, $8r$, ..., $2^{n-1}r$ or $10^0(r, 2r, 4r, 8r)$, $10^1(r, 2r, 4r, 8r)$, ..., $10^{n-1}(r, 2r, 4r, 8r)$, where $r$ is a minimum, or unit, resistance value. The unit resistance value $r$ multiplied by a multiplier $N$ of two or more digits is equal to the resistance value of the variable resistor bank. This multiplier $N$ expressed in decimal notation is set by means of a multiplier-setting circuit, which causes the switch control circuit to selectively open the switches, thereby adjusting the resistance value of the variable resistor bank according to the value of $N$ so that the output voltage of the bank equals the full-scale voltage of the voltmeter, at which condition the value of $N$ coincides with the magnitude of the voltage to be measured, provided the latter is not less than the full-scale voltage of the voltmeter, in which event an error indication is given.

6 Claims, 4 Drawing Sheets

POTENTIOMETER FOR VOLTAGE-MEASURING INSTRUMENT

This application is a continuation of application Ser. No. 868,433, filed May 30, 1986, abandoned.

FIELD OF THE INVENTION

The present invention relates to a potentiometer for association with an instrument that measures DC or RF voltages and, more particularly, to a potentiometer comprising a variable resistor bank whose resistance is adapted to be switched between a number of values.

BACKGROUND OF THE INVENTION

A potentiometer of this kind is disclosed in U.S. Pat. No. 4,433,287 at FIG. 6 thereof, where a fixed resistor Rf having a resistance of 100r, a variable resistor Rv, and an impedance transformer A1 are connected. The variable resistor Rv comprises a series combination R1 of resistors each having a high resistance of 100r, a series combination R2 of resistors each having an intermediate resistance of 10r, and a series combination R3 of resistors each having a low resistance of r. When sliders are placed in arbitrary positions along the resistor groups R1-R3 having such different orders of magnitude of resistances, i.e., when X resistors of the group R1, Y resistors of the group R2, and Z resistors of the group R3 are connected into the circuitry, the input voltage Vi is given by the relationship $$V_i = V_0 \{100r + (X - 1)100r + Y10r + Zr\}/100r$$
$$= V_0 (X + 0.1Y + 0.01Z)$$

where $V_0$ is the output voltage.

Thus, the output voltage gives a full-scale indication while the input voltage provides an indication magnified according to the multiplier expressed by three digits X, Y, Z and is measured. For example, at the illustrated positions, $V = 3.62 \, V_0$.

When this potentiometer is employed, the full-scale reading of the voltage-measuring instrument can be widely varied at will in minute steps. Further, the set value can be read directly as the measured value. However, the potentiometer is bulky, because as many resistors as the steps of resistance are needed for each order of magnitude of resistance, as well as the associated switching circuit. Further, the use of a rotary switch makes the potentiometer unsuitable for digital control.

In consideration of the foregoing, another potentiometer for a voltage-measuring instrument has been proposed in Japanese patent application No. 262983/1985, where banks of resistors are connected in series according to the number of digits of the set multiplier to form a variable resistor. Each bank of resistors consists of four resistors whose resistances are respectively 1, 2, 4, 8 times a minimum resistance. A digital switch or the like produces a BCD (binary-coded decimal) signal to control the multiplier. Yet, this potentiometer does not allow the multiplier to be set less than the greatest order of magnitude of resistance. Therefore, a maximum voltage division ratio greater than 10:1 cannot be obtained.

SUMMARY OF THE INVENTION

In view of the foregoing, it is an object of the present invention to provide a potentiometer for a voltage-measuring instrument, which is simple in structure and is capable of varying the voltage division ratio over a broader range.

The above and additional objects of the invention are achieved by a potentiometer comprising: an impedance transformer to which a voltage to be measured is applied; a variable resistor bank whose resistance is switchable between several values, the resistor bank being connected to the output terminal of the transformer; and a fixed resistor connected in series with the variable resistor bank. The resistance of the variable resistor bank is so adjusted that the voltage drop produced across the fixed resistor becomes equal to a predetermined level. The measured voltage is determined from the voltage division ratio obtained at this time.

Other objects and features of the invention will appear in the course of the description thereof which follows:

BRIEF DESCRIPTION OF THE DRAWINGS

FIG. 2($b$) is a circuit diagram of an alternative bank of resistors equipped with individual switches and having resistance values of $10^m \cdot 2^{n-1}$r, the bank of resistors being also usable as the bank 2 shown in FIG. 1;

FIG. 2($c$) is a diagram of an equivalent circuit for the arrangement shown in FIG. 1;

DETAILED DESCRIPTION OF THE INVENTION

Figure 1:
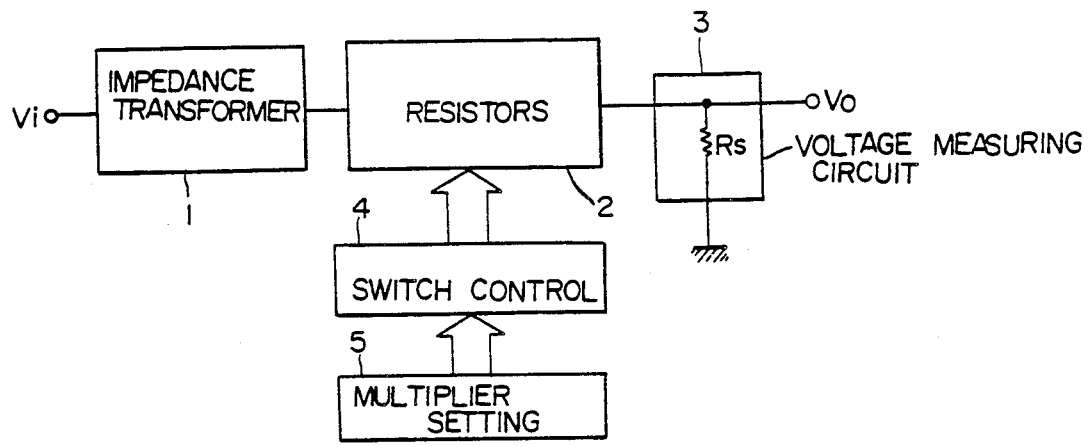
FIG. 1 is a block diagram of a potentiometer in association with a voltage-measuring instrument and built in accordance with the present invention.
Figure 2A:
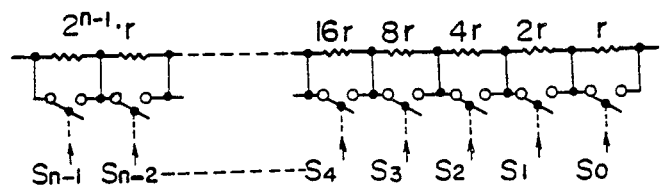
FIG. 2($a$) is a circuit diagram of a bank of resistors equipped with individual switches and having resistances r, 2r, 4r, 8r, ..., $2^{n-1}$r, the bank of resistors being usable as the bank 2 shown in FIG. 1.
Figure 2B:
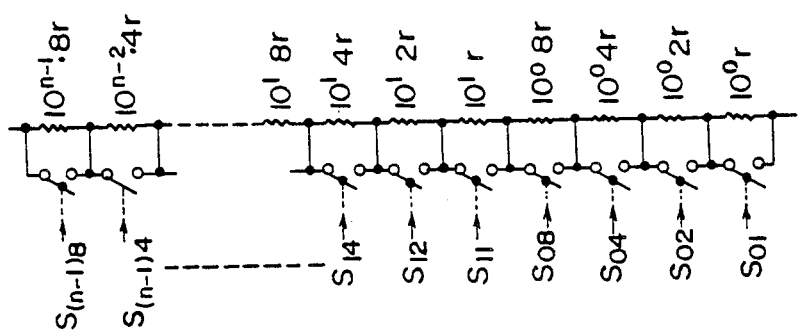

The concept of the potentiometer according to the present invention is first described by referring to FIG. 1. The potentiometer has an impedance transformer 1, a bank of resistors 2 connected to the output of the transformer 1, and a voltage-measuring circuit 3, e.g., of a voltage measuring instrument such as a volt-meter, having a certain voltage sensitivity, i.e., a voltage at which the indicator of the voltmeter reads full scale. The input resistance Rs of the voltmeter is equal to the minimum, or unit, resistance value r of the resistor bank 2 multiplies by a constant K. Constant K is a dimensionless number of a magnitude equal to the magnitude of the voltage sensitivity of the voltmeter. Thus, in equation terms $Rs = K \times r$. A voltage Vi to be measured is applied to the input terminal of the transformer 1. The transformer 1, the resistor bank 2, and the voltage-measuring circuit 3 are connected in series. Each resistor of the bank has an individual switch connected in parallel across the corresponding resistor. The bank 2 can take the forms shown in FIG. 2(a) or (b). In FIG. 2(a), the resistors have resistance values r, 2r, 4r, 8r, 16r, ..., $2^{n-1}$r and are equipped with corresponding switches $S_0$, $S_1$, $S_2$, $S_3$, $S_4$, ..., $S_{n-1}$, respectively. In FIG. 2(b), the resistors have resistance values $10^0$r, $10^0$2r, $10^0$4r, $10^0$8r, $10^1$r, $10^1$2r, ..., $10^{n-1}$8r and are equipped with corresponding switches $S_{01}$, $S_{02}$, $S_{04}$, $S_{08}$, $S_{11}$, $S_{12}$, ..., $S_{(n-1)8}$, respectively.

The potentiometer further includes a multiplier-setting circuit 5 for allowing the user to set a multiplier N of two or more digits, the multiplier being expressed in decimal notation. The collective resistance value of the variable resistor formed by the resistor bank 2 is the resistance r multiplied by the multiplier N. A signal indicating the multiplier N is delivered from the circuit 5 in binary-coded decimal notation to a switch control circuit 4. Thus, the control circuit 4 selectively opens and closes the individual switches of the bank 2 according to the setting for N, in order that the resistance Rx of the variable resistor bank is adjusted to a value equal to N×r−Rs.

The multiplier-setting circuit 5 can be manually or automatically operated and delivers a signal indicating the multiplier N (= ... $+10^2N_2+10^1N_1+10^0N_0$, where $N_0$, $N_1$, $N_2$, and so on are natural numbers) in binary-coded decimal. The control circuit 4 delivers a signal coded so as to satisfy the relationship:

$$Rx = r \times N (= \ldots + 10^2N_2 + 10^1N_1 + 10^0N_0) - Rs$$

The switches connected in parallel across their respective resistors are opened and closed individually by the output from the control circuit 4.

Figure 2C:
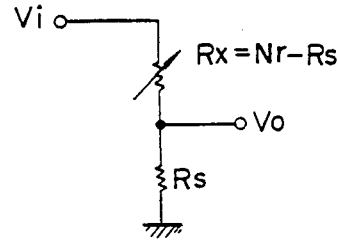

An equivalent circuit for the arrangement of FIG. 1 is shown in FIG. 2(c), where the output voltage $V_0$ from the voltage-measuring circuit 3 is equal to the voltage sensitivity of the voltmeter provided that the voltage Vi is measured after the multiplier N has been so set that the output voltage $V_0$ is made equal to full-scale voltage or the voltage sensitivity of the voltmeter. By also making use of the aforementioned relation Rx=N×r−Rs, one gets:

$$\begin{aligned} Vi &= V_0(Rs + Rx)/Rs - K(N \times r)/Rs \\ &= K(N \times r)/(K \times r) = N \\ &= \ldots 10^2N_2 + 10^1N_1 + 10^0N_0 \end{aligned}$$

That is, the multiplier N which is set by the use of the setting circuit 5 to make the voltage-measuring circuit 3 give a fullscale indication will itself indicate the measured voltage Vi.

Where N×r−Rs<0, the set multiplier N will not provide a full reading on the voltmeter. In this case, a warning is issued, or the multiplier N presented on the display unit is maintained at a certain value.

Figure 3:
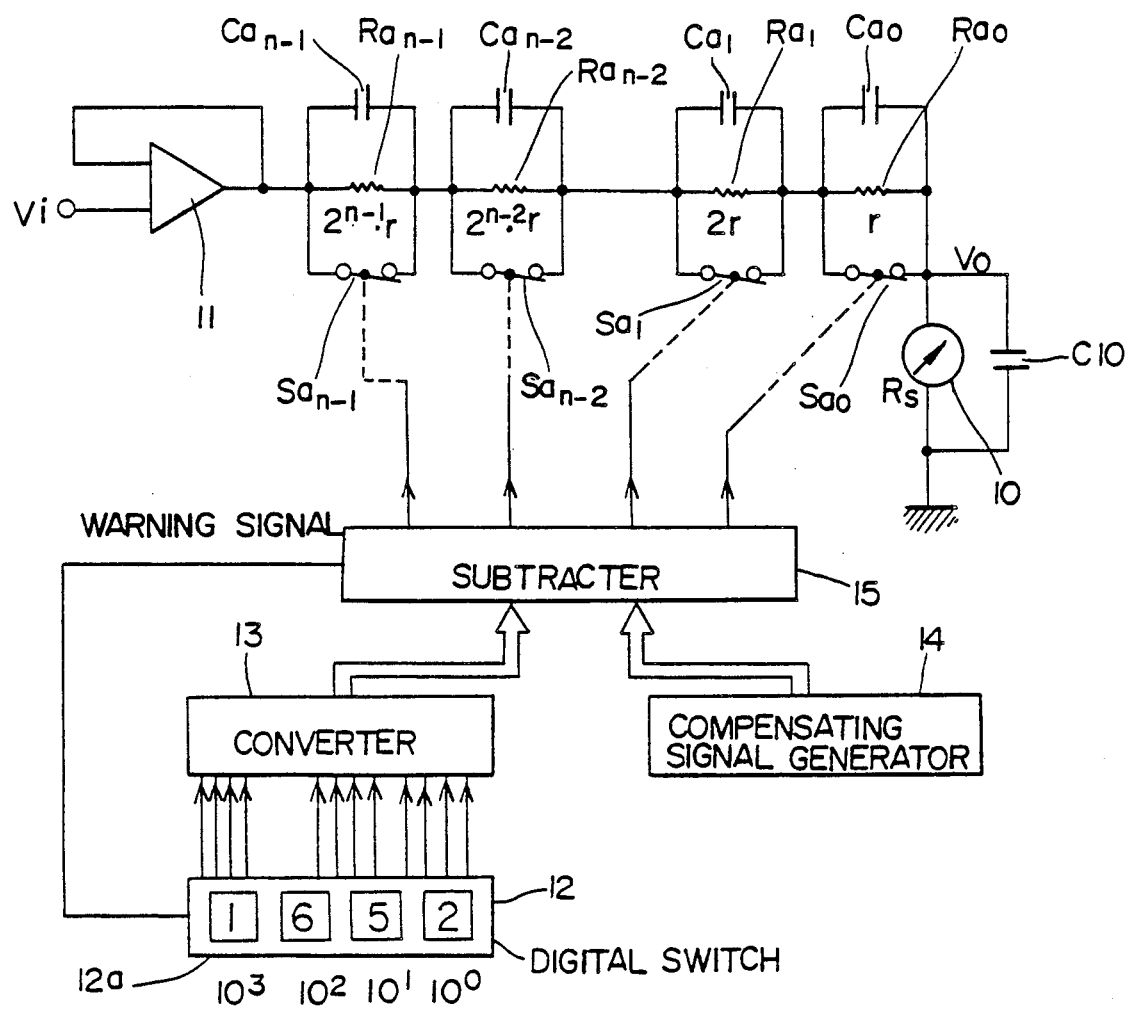
FIG. 3 is a circuit diagram of a potentiometer with a voltage-measuring instrument and built in accordance with the invention, and in which the resistors of the bank have resistance values r, 2r, 4r, ..., $2^{n-1}$r as in FIG. 2($a$)

Referring next to FIG. 3, there is shown one example of a potentiometer according to the invention. This potentiometer is associated with a voltmeter 10 having a voltage sensitivity of 100 mV and an input resistance (or fixed resistance) Rs of 100 Ω. The potentiometer includes an impedance transformer 11 having a high input impedance and a low output impedance. A bank of resistors $R_{a0}$, $R_{a1}$, ..., $R_{an-1}$ that acts as a variable resistor is connected to the output of the transformer 11. The resistor $R_{a0}$ has a minimum resistance value of r (=1 Ω, for example). The resistors $R_{a1}$, $R_{a2}$, ..., $R_{an-1}$ have resistance values r, 2r, 4r, ..., $2^{n-1}$r, respectively.

Reed switches $S_{a0}$, $S_{a1}$, ..., $S_{an-1}$ are connected in parallel across the resistors $R_{a0}$, $R_{a1}$, ..., $R_{an-1}$, respectively. Also, capacitors $C_{a0}$, $C_{a1}$, ..., $C_{an-1}$ for compensating high-frequency characteristics are connected in parallel across the resistors $R_{a0}$, $R_{a1}$, ..., $R_{an-1}$, respectively. Similarly, a capacitor $C_{10}$ is connected in parallel across the voltmeter 10. A digital switch 12 is used to set the multiplier N as a four digit number. That is, any resistance value set by the user is the unit resistance value r multiplied by the multiplier N. The switch 12 has a display portion 12a on which the set multiplier N is displayed in decimal notation. A signal indicating the multiplier is delivered in BCD form to a converter circuit 13 for converting the BDC signal into a form indicating r, 2r, 4r, 8r, ..., $2^{n-1}$r. The output signal from the converter circuit 13 corresponds to the previously set multiplier N. A compensating signal-generating circuit 14 produces a signal corresponding to K=100. This signal takes the same form as the output from the converter 13. A subtractor circuit 15 produces a signal corresponding to the difference (N−K) between the output signal from the converter circuit 13 and the output signal from the compensating signal-producing circuit 14 to selectively or individually open the switches $S_{a0}$, $S_{a1}$, ..., $S_{an-1}$. If the relation N<K should obtain and be ascertained by the subtracter, the subtracter circuit performs one of the following operations: (1) It issues a warning signal to prevent the occurrence of errors; (2) The set multiplier in decimal notation is not displayed on the display portion 12a of the digital switch 12, nor does the switch produce the corresponding output signal; and (3) The resistance Rx of the variable resistor bank is set equal to zero. In this way, normal operation is interrupted.

The potentiometer constructed as described above operates as follows. The voltmeter 10 with which, the potentiometer is associated has such a sensitivity, for example, that the application of 100 mV produces a full-scale indication. It is assumed that the multiplier N is set equal to 1652 by means of the digital switch 12 under the condition that radio-frequency Vi=1.652 V=1652 mV is applied. The multiplier number in decimal notation is converted into a signal corresponding to 4, 2r, 4r, 8r, ..., $2^{n-1}$ by the converter circuit 13 and supplied to the subtracter circuit 15. Then, the subtracter circuit 15 produces a signal corresponding to the difference between the output signal from the converter circuit 13 and the output signal from the compensating signal-producing circuit 14. The signal from the compensation circuit 14 will indicate "100". Thus, the output signal from the subtracter circuit 15 is so coded as to correspond to $(10^3 \times 1 + 10^2 \times 6 + 10^1 \times 5 + 10^0 \times 2) - 100 = 1552$. The values of the resistors $R_{a0}$ through $R_{an-1}$ are obtained by multiplying by Ω. Since Rx=1552 Ω and Rs=K×r=100 Ω, the voltage applied to the voltmeter is given by $$\begin{aligned} V_0 &= \frac{Rs}{Rx + Rs} Vi \\ &= \frac{100}{1552 + 100} \times 1652 \text{ mV} \\ &= \frac{100}{1652} \times 1652 \text{ mV} \\ &= 100 \text{ mV} \end{aligned}$$

Thus, the application of 1652 mV causes the voltmeter to indicate a full-scale indication, the sensitivity of the voltmeter being 100 mV. If the multiplier N set using the switch 12 is less in magnitude than the magnitude of the voltage sensitivity 100 mV of the voltmeter 10 ($N<100$), then the subtracter circuit 15 issues a warning, simply makes a voltage measurement while maintaining Rx at null, or makes the switch 12 inoperative.

When the sensitivity of the voltmeter 10 is lowered to 50 mV, the compensating signal-producing circuit 14 produces a signal corresponding to the lowered sensitivity value and in that case, when $r=1$ Ohm, Rs 50 $\Omega$. When the voltage sensitivity of the voltmeter is set to 200 mV and the minimum resistance r is 10 $\Omega$, Rs=2000 Ohm.

Figure 4:
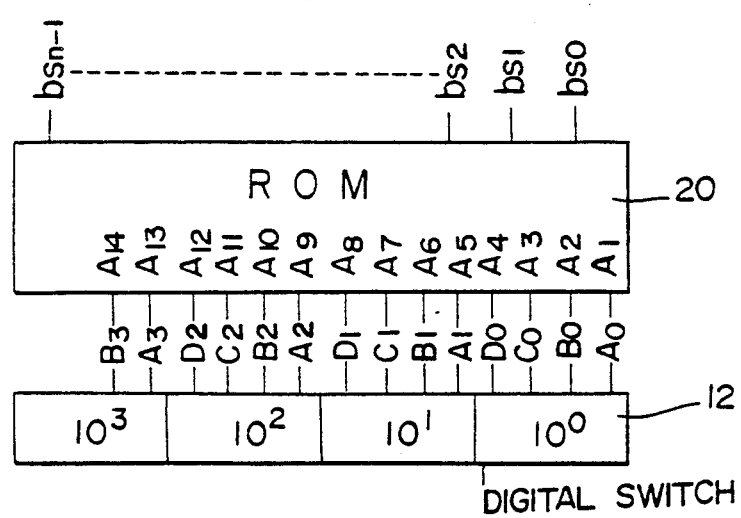
FIG. 4 is a diagram showing a portion of a modification of the potentiometer circuit shown in FIG. 3.

The converter circuit 13, the compensating signal-producing circuit 14, and the subtracter circuit 15 shown in FIG. 3 are combined into a unit for selectively opening the switches. In particular, as shown in FIG. 4, the contents of a ROM 20 are addressed by the output signal from the digital switch 12. The data from the subtracter circuit 15 is stored in the ROM 20. Where $N \times r - Rs < 0$ as mentioned previously, data resulting in $Rx=0$ is stored in the ROM 20. For example, all the bits $b_{s0}-B_{sn-1}$ are set to 0. Depending on the kinds of the switches $S_{a0}-S_{an-1}$ and their associated circuitry, all the bits may be set to 1. In this way, the voltmeter is caused to directly read the input voltage $V_i$; otherwise, special data is stored in the ROM to produce a warning signal.

Figure 5:
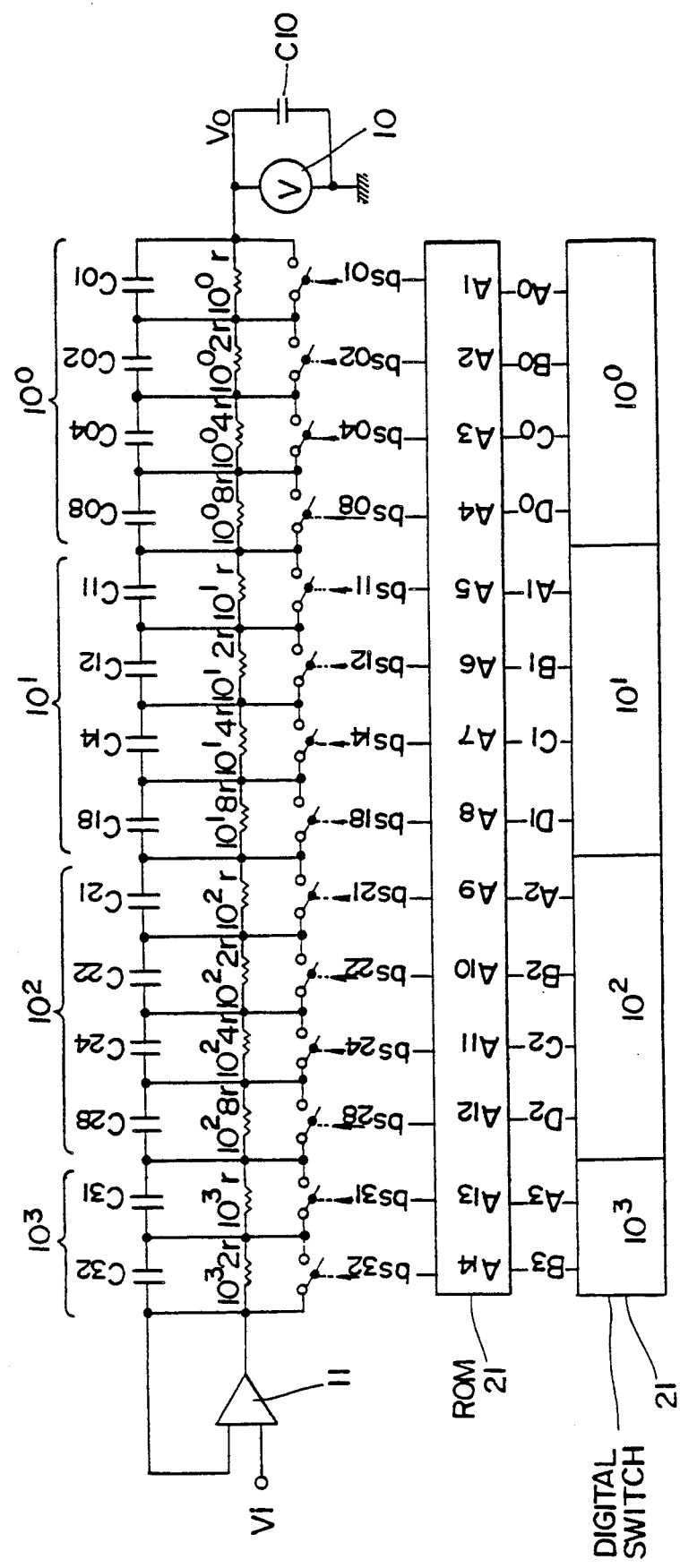
FIG. 5 is a circuit diagram of another potentiometer according to the invention, and in which the resistors of a bank have resistances $10^m \cdot 2^{n-1}$r as in FIG. 2($b$)
Figure 6:
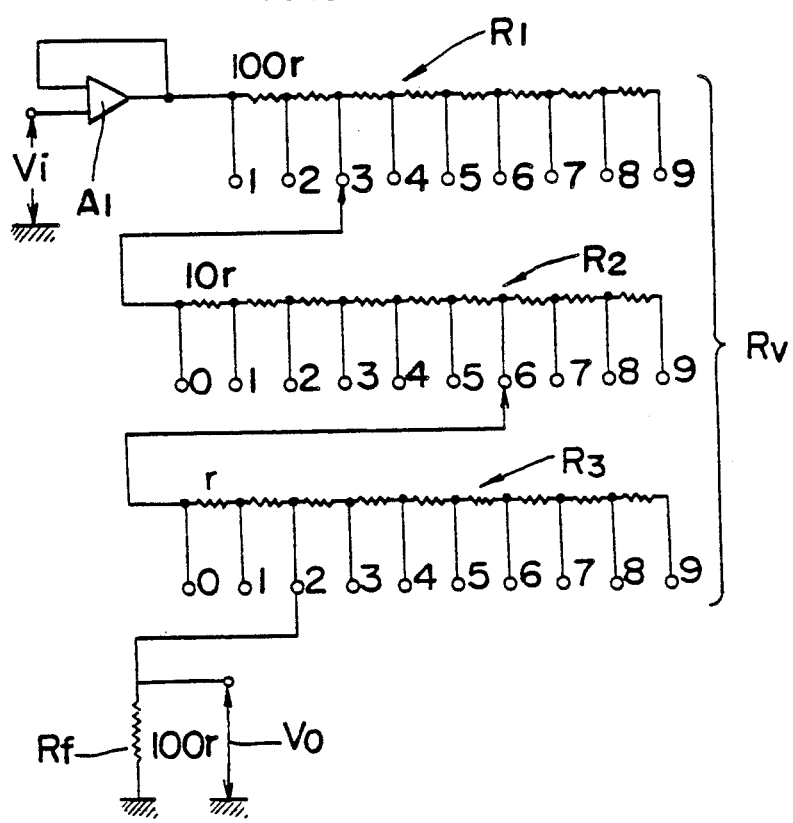
FIG. 6 is a circuit diagram of the prior art potentiometer for use with a voltage-measuring instrument as summarized above with the potentiometer slides at the indicated positions.

In the above example, the resistors have resistance values $r, 2r, 4r, 8r, \ldots, 2^{n-1}r$. Referring to FIG. 5, the resistors here have resistance values $10^0r, 10^02r, 10^04r, 10^08r, 10^1r, 10^12r, 10^14r, 10^18r, 10^2r, \ldots, 10^32r$. The collective resistance value Rx of the variable resistor bank is adjusted to $N \times r - Rs$ by a switch control circuit. Data used for this adjustment may be stored in a ROM 21. The switch control circuit can consist of a compensating signal-producing circuit and a subtracter circuit in the same manner as the control circuit shown in FIG. 3.

The multiplier-setting circuit can consist of an automatic control circuit or the like which produces an output signal for setting the multiplier N in such a way that the output voltage $V_0$ from the voltage-measuring circuit automatically gives a full-scale indication. The control circuit also displays the set value.

As described thus far, the novel potentiometer is made up of a fewer number of voltage-dividing resistors and occupies less space than the conventional rotary switch-type potentiometer. Further, the multiplier can be easily switched between different values under remove control. In addition, the collective resistance value of the variable resistor can be readily adjusted automatically. Also, the multiplier can be set over a range beyond the voltage sensitivity range of a voltage-measuring circuit. Therefore, a voltage division ratio can be obtained over a greatly extended range, resulting in a broader measuring range. If the fixed input resistance and the sensitivity of the voltage-measuring circuit, such as a voltmeter, have to be modified, all that is needed is a modification of the subtrahend; it is not necessary to adjust the variable resistor bank itself.

What is claimed is:

1. A potentiometer in association with a voltage-measuring instrument which exhibits a full-scale indication when a predetermined voltage is applied thereto and comprising:
    an impedance transformer having an input terminal to which a voltage to be measured is applied, said transformer having a high input impedance and a low output impedance;
    a bank of resistors connected in series to the output of the transformer and acting collectively as a variable resistor, each of the resistors having an associated switch connected in parallel across the same whereby by the opening and closing of such switches the resistors in said bank can be individually and selectively connected in series to give a variable resistance Rx, said resistors having resistance values $r, 2r, 4r, 8r, \ldots, 2^{n-1}r$ or $10^0(r, 2r, 4r, 8r), 10^1(r, 2r, 4r, 8r), \ldots, 10^{n-1}(r, 2r, 4r, 8r)$, where r is the minimum, or unit, resistance value and n is an integer equal to at least four which determines an operative digit range;
    said voltage-measuring instrument being connected in series with said bank of resistors and having an input resistance Rs, where $Rs = K \times r$, K being a constant in dimensionless form corresponding in magnitude to said predetermined full-scale voltage of said voltage-measuring instrument;
    a switch control circuit responsive to a signal delivered thereto for selectively and individually opening and closing the switches associated with the respective resistors of said variable resistor bank to thereby adjust the value of said variable resistance Rx of said variable resistor bank;
    an adjustable multiplier-setting means operatively associated with said switch control circuit for setting in decimal notation a multi-digit multiplier number N within said operative digit range which is equal to the total of the collective resistance Rx of the variable resistor bank and the input resistance Rs of the voltage measuring instrument divided by the unit resistance value r, for regulating said switch control circuit to adjust the collective resistance value Rx of said variable resistor bank such that the voltage to be observed multiplied by the resistance value ratio $Rs/(Rx+Rs)$ equals said predetermined full-scale voltage of said voltage measuring instrument, provided the magnitude of said voltage to be observed is not less than said constant K said multiplier-setting means delivering to said switch control circuit an output signal corresponding to the thus-set multiplier, whereby the multiplier setting number N directly corresponds to the magnitude of the voltage to be observed; and
    means for detecting if said multiplier number N is less in magnitude than said constant K of said instrument to thereby indicate said voltage to be observed is less in magnitude than said constant K and providing an indication of such detection to avoid an error.

2. The potentiometer of claim 1, wherein the detecting means comprises means for generating a compensating signal corresponding to said voltage sensitivity K, and means for comparing said output signal for said multiplier setting means with said compensating signal and issuing a warning signal when said output signal is smaller than said compensating signal.

3. A potentiometer in association with a voltage-measuring instrument as set forth in claim 1, wherein the multiplier-setting means is a digital switch that is operated manually.

4. A potentiometer in association with a voltage-measuring instrument as set forth in claim 1, wherein the multiplier-setting means is an automatic control circuit whose output signal is automatically varied according to the measure voltage.

5. A potentiometer in association with a voltage measuring instrument as set forth in claim 1 which further comprises a capacitor connected across each of the resistors constituting said bank of resistors, the number of capacitors so connected equaling the number of resistors in said bank.

6. The potentiometer of claim 6 wherein said multiplier-setting means includes digital display means for number N set thereby.

* * * * *